United States Patent [19]
Wong et al.
[11] 3,828,228
[45] Aug. 6, 1974

[54] MICROWAVE TRANSISTOR PACKAGE

[75] Inventors: Roger W. Wong, Santa Clara; Ronald D. Stewart, Ben Lomond, both of Calif.

[73] Assignee: Hewlett-Packard Company, Palo Alto, Calif.

[22] Filed: Mar. 5, 1973

[21] Appl. No.: 337,965

[52] U.S. Cl. ........ 317/234 R, 174/52 S, 317/234 A, 317/234 G, 333/84 M
[51] Int. Cl. ............................ H01l 3/00, H01l 5/00
[58] Field of Search .................... 317/234, 1, 4, 4.1; 333/84 M; 174/52 S

[56] References Cited

UNITED STATES PATENTS

| | | | |
|---|---|---|---|
| 3,404,214 | 10/1968 | Elliott | 317/234 A |
| 3,478,161 | 11/1969 | Carley | 317/234 G |
| 3,577,181 | 5/1971 | Belohoubek | 333/84 M |
| 3,611,059 | 10/1971 | Carley | 317/234 |
| 3,728,589 | 4/1973 | Caulton | 317/234 A |
| 3,733,525 | 5/1973 | Robinson et al. | 317/234 G |

*Primary Examiner*—Andrew J. James
*Attorney, Agent, or Firm*—Roland I. Griffin

[57] ABSTRACT

A package for containing a microwave transistor chip is constructed so that a surface on which the transistor chip is to be mounted is recessed below a metallized surface which serves as an electrical ground. By means of this construction, a mounted transistor chip will be positioned with its top surface just below the plane of the electrical ground surface. Thus, the leads which connect the transistor to the electrical ground surface may be very short, thereby reducing the occurrance of package parasitics, and in particular minimizing the spurious common emitter inductance. According to one embodiment of the invention, a cap is used which is in electrical contact with the electrical ground surface of the package, the cap having a recessed inner portion to assure that no contact is made between the cap and any leads which are bonded to the transistor chip and the package.

3 Claims, 5 Drawing Figures

MICROWAVE TRANSISTOR PACKAGE

BACKGROUND AND SUMMARY OF THE INVENTION

This invention relates generally to transistor packages, and more particularly to an improved package for high frequency microwave transistors. A major problem in packaging high frequency microwave transistor chips is the occurrance of "package parasitics" which degrade the performance of the transistor. These parasitics are spurious inductances and capacitances attributable to the physical configuration of the package itself and to the leads which are bonded to the transistor and the package. It is particularly important to minimize spurious inductances caused by the leads connected to a common emitter, since these cannot be "tuned out" using external circuitry, as can be done with other parasitics.

Heretofore, microwave transistor packages have been constructed in which the transistor chip is mounted so that its base is flush with the top surface of the package. An example of this kind of packaging is the Hewlett-Packard Model No. 35876E High Frequency Microwave Transistor Package. Typically, a segment of the top surface of the package is metallized to serve as a ground, there being a lead connected between the emitter of the transistor chip and the metallized ground. One end of the emitter lead is bonded to a metal pad on the top of the transistor chip itself, while the other end of the lead is bonded to the metallized surface of the package which serves as ground. Since the top of the transistor chip is spacially displaced from the ground surface, the common emitter lead must be made relatively long to effect a connection. The long lead required introduces undesirable spurious common emitter inductance into the package.

In accordance with one of the illustrated preferred embodiments, the present invention significantly reduces the parasitic common emitter inductance by having a section of the package on which the microwave transistor chip is mounted recessed below the plane of the metallized surface of the package which serves as electrical ground. The support is recessed by a sufficient distance so that the top of the microwave chip mounted on it lies just below the plane of the metallized surface of the package. Thus the emitter bonding pad on the chip is positioned adjacent to and in close proximity with the metallized surface (ground), and the common emitter lead going to ground can be made very short. The parasitic emitter inductance is thus greatly reduced, resulting in a significant power gain over the high frequency microwave transistors known in the prior art.

In accordance with another of the illustrated embodiments, the present invention utilizes a metal cap as a ground connection to the external circuit. The cap is electrically connected to the metallized electrical ground surface of the package. In order to further reduce package parasitics and increase the reliability of the device, the cap includes a recess so that the leads connected to the transistor chip cannot come in contact with the cap in a non-predictable manner.

DESCRIPTION OF THE PREFERRED EMBODIMENTS

Figure 1:
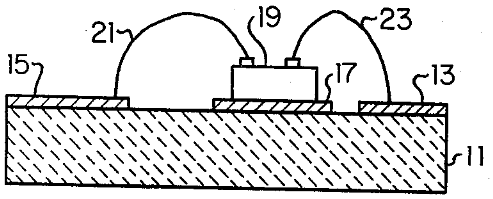
Figure 1 (PRIOR ART)
FIG. 1 shows a cross-sectional view of part of a microwave transistor package as was known in the prior art.

Referring to FIG. 1, a ceramic body 11 is constructed of a ceramic material such as Alumina ($Al_2O_3$) or BeO. The top surface of the ceramic body 11 is partially metallized to form an electrical ground 13 and a floating conducting surface 15. Another part of the surface 17 is also metallized to serve as a base on which a microwave transistor chip 19 is mounted. To avoid ground surface 17, there must be a gap between that surface and the electrical ground 13. A base lead 21 is bonded to the chip 19 and to the conducting surface 15. An emitter lead 23 is bonded to the chip 19 and to the ground surface 13. Since the top surface of the chip 19 is located a distance above the plane of the ground surface 13, and since there is a gap between the surface 17 and the surface 13, the common emitter lead 23 must be relatively long (compared to the dimensions of the chip). Typically the lead length is 0.025 inches compared with a chip diameter of 0.015 inches. The common emitter lead 23 thus produces a large parasitic common emitter inductance. As was mentioned above, it is not possible to eliminate such a common emitter inductance by tuning it out with an external circuit.

Figure 2:
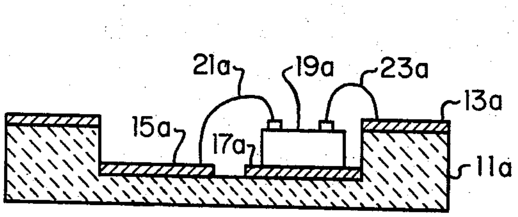
FIG. 2 is a cross-sectional view of part of a microwave transistor package including a recessed mounting section.

FIG. 2 shows a ceramic body **11*a* of a ceramic material such as Alumina ($Al_2O_3$) or BeO. The top surface of the ceramic body 11*a* is partially metallized to form an electrical ground surface 13*a*. A recessed surface is metallized to provide a floating conducting surface 15*a*. Another recessed surface is metallized to provide a base 17*a* on which a transistor chip 19*a*** is mounted.

A base lead **21*a* is bonded to the chip 19*a* and to the conductor 15*a*. Another lead 23*a* is bonded to the chip 19*a* and to the ground surface 13*a* to provide a common emitter lead. The section of the package 17*a* which supports the chip 19*a* is recessed below the plane of the ground surface 13*a* by an amount slightly greater than the height of the chip itself. Because of this recessing of the surface 17*a*, the top of the chip is positioned just below the plane of the ground surface 13*a*. Additionally, it is not necessary to provide a horizontal gap between the surface 17*a* and the surface 13*a*, to avoid grounding the surface 17*a*. This advantageous positioning allows the use of a very short common emitter lead 23*a*, typically about 0.010 inches. The parasitic common emitter inductance is reduced by about 50 percent compared to that in a typical device known in the prior art, with a concomitant increase in the power output. In this configuration, the conducting surface 15*a*** is recessed also.

Figure 3:
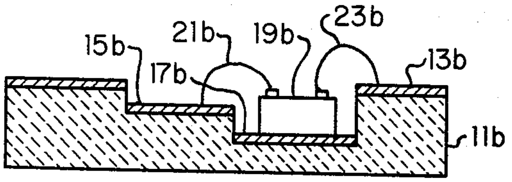
FIG. 3 is a cross-sectional view of part of a three-level microwave transistor package including a metallized electrical surface which is recessed to a lesser extent than is a recessed metallized mounting surface.

In FIG. 3 there is shown a supporting surface 17*b* which is recessed as was the corresponding surface in FIGS. 1 and 2. In this embodiment, however, the conducting surface 15*b* is recessed to a lesser extent, so that the surface 15*b* is in closer proximity to the transistor chip 19*b*. Additionally, no horizontal gap is required to avoid electrical contact between the surfaces 15*b* and 17*b*. Consequently, a short base lead 21*b* may be used, thereby reducing the parasitic base inductance. It is evident that the extent to which the conducting surface 15*b* is recessed may vary depending on such factors as convenience of manufacture, and ease of packaging.

Figure 4:
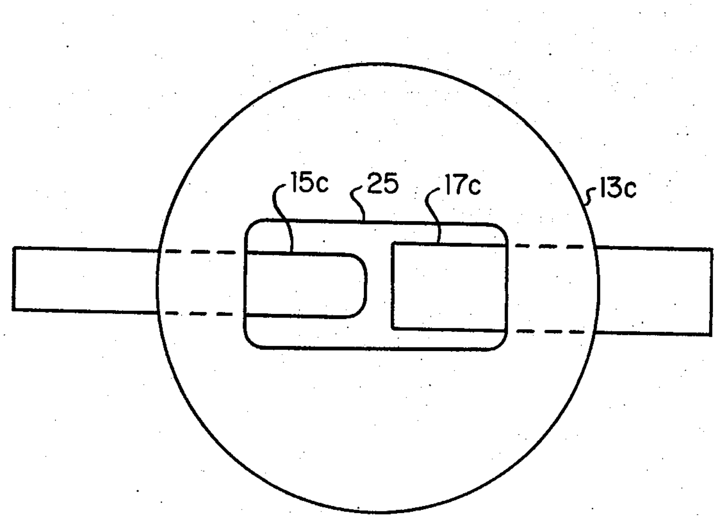
FIG. 4 is a top view of a cylindrical microwave transistor package including a slot in which are positioned a recessed mounting surface and a recessed conducting surface.

In FIG. 4 there is shown a top view of a package of circular cross-section including a metallized ground surface 13*c*. Also shown is a slot 25 in which are located a recessed section 17*c* which for a microwave transistor chip (not shown), and a recessed section 15*c* which serves as a conducting member to which a base lead from the transistor chip may be bonded.

Figure 5:
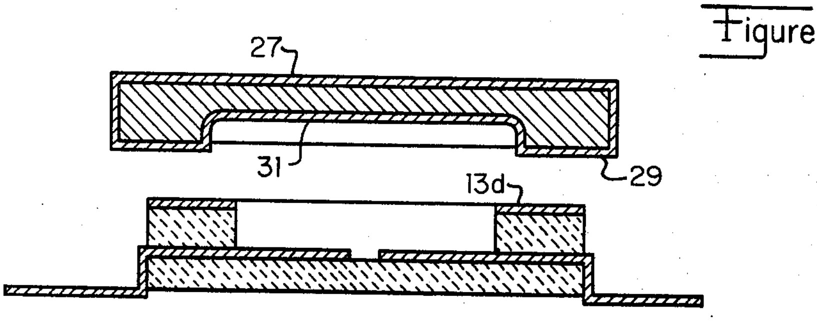
FIG. 5 is a cross-sectional view of a microwave transistor packaging including a cap which may be used to make electrical contact between the package and an external ground.

In FIG. 5, a metallized surface 29 of a cap 27 is electrically connected to a ground surface 13*d* of the package, so that the cap itself may be used to connect the package to an external ground. The cap 27 includes a recessed slot 31 which assures that any leads bonded to a transistor chip mounted in the package will not come into electrical contact with the cap. This configuration eliminates package parasitics arising from unintended contact between those leads and the cap 27, thereby increasing the reliability of the device.

We claim:

1. A microwave transistor package containing a microwave semiconductor chip and electrical leads connected to said chip comprising:

a main body section having an inner slot;

a first metallized electrical ground surface in contact with said main body;

a second metallized floating electrical contact surface positioned in said inner slot and recessed below said first metallized electrical ground surface;

a third metallized mounting surface upon which said microwave semiconductor chip is mounted, the third metallized surface being recessed below the plane of the second metallized electrical floating surface and positioned in said inner slot; and a ground cap which is in electrical contact with the first metallized electrical ground surface, the cap having a recessed inner section for preventing unwanted contact of the cap with the electrical leads in the package.

2. A package as in claim 1 wherein the second metallized surface is recessed below the plane of the first metallized surface by a distance substantially less than the distance by which the third metallized mounting surface is recessed below the first metallized ground surface.

3. A package as in claim 2 wherein the main body section is constructed of a ceramic material selected from the group consisting of $Al_2O_3$ and BeO.

* * * * *